United States Patent [19]

Kazumi

[11] Patent Number: 6,117,758
[45] Date of Patent: Sep. 12, 2000

[54] ETCH REMOVAL OF ALUMINUM ISLANDS DURING MANUFACTURE OF SEMICONDUCTOR DEVICE WIRING LAYER

[75] Inventor: Sugai Kazumi, Tokyo, Japan

[73] Assignee: NEC Corporation, Tokyo, Japan

[21] Appl. No.: 09/080,743

[22] Filed: May 18, 1998

[30] Foreign Application Priority Data

May 28, 1997 [JP] Japan .................................... 9-138483

[51] Int. Cl.$^7$ .................................................. H01L 21/44
[52] U.S. Cl. ......................... 438/597; 438/652; 438/656; 438/660; 438/687; 438/688
[58] Field of Search ................................... 438/597, 652, 438/656, 660, 687, 688

[56] References Cited

U.S. PATENT DOCUMENTS

| 5,521,119 | 5/1996 | Chen et al. | 438/629 |
| 5,545,591 | 8/1996 | Sugai et al. | 438/656 |
| 5,629,236 | 5/1997 | Wada et al. | 438/607 |

FOREIGN PATENT DOCUMENTS 6-236874  8/1994  Japan .

OTHER PUBLICATIONS

Brown et al, Development and Production Integration of a Planarized AlCu Interconnect Process for Submicron CMOS, (Proceeding of the International Society of Optical Engineering, Oct. 1995, vol. 2636), pp. 234–243.

S. Wolf and R. N. Tauber, Silicon Processing for the VLSI Era, vol. 1–Process Technology, (Lattice Press, California, 1986), pp. 559–564.

"The chemical vapor deposition of aluminum for interconnect and via application : an integration overview" by R. W. Fiordalice, Proceedings Metallization and Interconnect Systems for ULSI Application in 1996.

"The chemical vapor deposition of Aluminum for interconnect and via applications : an integration overview" by R Fiordalice et al. Conference Proceeding ULSI XII 1997 Materials Research Society, pp. 13–21.

*Primary Examiner*—Richard Elms
*Assistant Examiner*—Christian D. Wilson

[57] ABSTRACT

In a method of manufacturing a semiconductor device, a first wiring layer is formed on a semiconductor substrate. An interlevel insulating film is formed on the semiconductor substrate to cover the first wiring layer. A wiring groove is formed in the interlevel insulating film so as to pass a contact hole formed in the interlevel insulating film to such a depth as to expose the first wiring layer. A contact is formed in the contact hole by depositing a first conductive material on the first wiring layer exposed at the bottom of the contact hole. An island made of the first conductive material and formed on the surface of the interlevel insulating film upon forming the contact is etched and removed. A second wiring layer is formed in contact with the contact by burying a second conductive material in the wiring groove.

9 Claims, 3 Drawing Sheets

6,117,758

ETCH REMOVAL OF ALUMINUM ISLANDS DURING MANUFACTURE OF SEMICONDUCTOR DEVICE WIRING LAYER

BACKGROUND OF THE INVENTION

The present invention relates to a semiconductor device manufacturing method of forming a wiring layer.

In forming a multilayered structure on a substrate, each wiring layer must be made flat. The technique of forming a flat wiring layer includes the method described in "The chemical vapor deposition of aluminum for interconnect and via applications: an integration overview", Proceedings Metallization and Interconnect Systems for ULSI Application in 1996 (reference 1).

The wiring layer forming method described in reference 1 will be explained with reference to FIGS. 3A to 3F. As shown in FIG. 3A, a lower aluminum wiring layer 303 is formed on a semiconductor substrate 301 via an insulating film 302, and then an interlevel insulating film 304 is formed on the insulating film 302 to cover the lower wiring layer 303.

As shown in FIG. 3B, a contact hole 305 for electrically connecting the lower wiring layer 303 is formed at a predetermined position in the interlevel insulating film 304. A wiring groove 306 passing the contact hole 305 is formed in the interlevel insulating film 304.

A native oxide film formed on the surface of the lower wiring layer 303 exposed at the bottom of the contact hole 305 is removed. In this removal, the bottom of the contact hole 305 is exposed to a chlorine-based gas plasma. The plasma is generated by supplying $Cl_2$ gas at a flow rate of 10 sccm and Ar gas at a flow rate of 50 sccm to a chamber evacuated to a pressure of about 3 mTorr, and applying the 13.56-MHz RF to the chamber at an output of 20 W.

As shown in FIG. 3C, an aluminum layer 307 is selectively deposited on the lower wiring layer 303 exposed at the bottom of the contact hole 305. The aluminum layer 307 is formed by chemical vapor deposition (CVD) using dimethylaluminum hydride $((CH_3)_2AlH)$ as a precursor. At this time, aluminum islands 307a are also formed on the interlevel insulating film 304.

As shown in FIG. 3D, a titanium nucleation layer 308 is formed thin on the interlevel insulating film 304 and the aluminum layer 307 by sputtering. Aluminum is deposited by batch CVD using the nucleation layer 308 as a nucleus to form an aluminum film 309 to be connected to the lower wiring layer 303 via the contact hole 305, as shown in FIG. 3E.

The upper portion of the aluminum film 309 is removed by chemical-mechanical polishing so as to expose the surface of the interlevel insulating film 304, thereby forming a wiring layer 310 connected to the lower wiring layer 303 via the contact hole 305, as shown in FIG. 3F.

However, forming the wiring layer 310 by the above method undesirably forms a gap 311 between the wiring layer 310 and the interlevel insulating film 304, as shown in FIG. 3F. This is because the aluminum islands 307a are also formed on the side wall of the interlevel insulating film 304 upon selectively depositing aluminum by CVD, as shown in FIG. 3C.

If the island 307a is formed on the side wall of the interlevel insulating film 304, a gap (broken portion) 308a where no nucleation layer 308 is formed is formed upon forming the nucleation layer 308, as shown in FIG. 3D. In the presence of the gap 308a, a void 312 is formed upon forming the aluminum film 309 by CVD, as shown in FIG. 3E. As a result, the gap 311 is formed at the boundary of the wiring layer 310 and the interlevel insulating film 304, as shown in FIG. 3F.

In the presence of the gap 311, the cross-sectional wiring area decreases in the wiring layer 310 near the gap 311, and thus the current density increases. At the portion whose cross-sectional wiring area is small, the temperature rises higher than in the remaining region upon application of a voltage, and electromigration easily occurs. If it occurs, the wiring layer 310 is disconnected to greatly degrade the reliability of the semiconductor device.

SUMMARY OF THE INVENTION

It is an object of the present invention to provide a semiconductor device manufacturing method capable of forming a flat wiring layer in a multilevel interconnect without degrading the reliability.

In order to achieve the above object, according to the present invention, there is provided a method of manufacturing a semiconductor device, comprising the steps of forming a first wiring layer on a semiconductor substrate, forming an interlevel insulating film on the semiconductor substrate to cover the first wiring layer, forming a wiring groove in the interlevel insulating film to pass a contact hole formed in the interlevel insulating film to a depth so as to expose the first wiring layer, forming a contact in the contact hole by depositing a first conductive material on the first wiring layer exposed at a bottom of the contact hole, etching and removing an island made of the first conductive material and formed on a surface of the interlevel insulating film upon forming the contact, and forming a second wiring layer in contact with the contact by burying a second conductive material in the wiring groove.

DESCRIPTION OF THE PREFERRED EMBODIMENTS

The present invention will be described in detail below with reference to the accompanying drawings.

First Embodiment

FIGS. 1A to 1F show a method of manufacturing a semiconductor device according to the first embodiment of the present invention, and particularly show the process of forming a wiring layer.

Figure 1A:
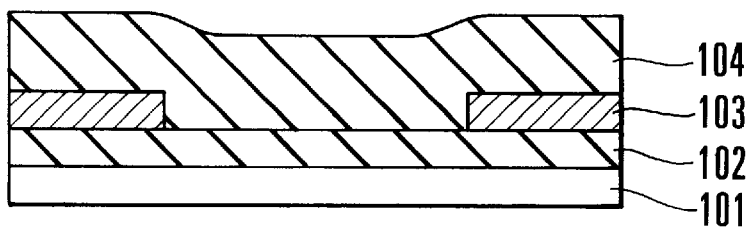
FIGS. 1A to 1F are cross-sectional views, respectively, showing a method of manufacturing a semiconductor device according to the first embodiment of the present invention.

As shown in FIG. 1A, a lower aluminum wiring layer (first wiring layer) 103 is formed on a semiconductor substrate 101 via an insulating film 102, and then an interlevel insulating film 104 is formed on the insulating film 102 to cover the lower wiring layer 103.

Figure 1B:
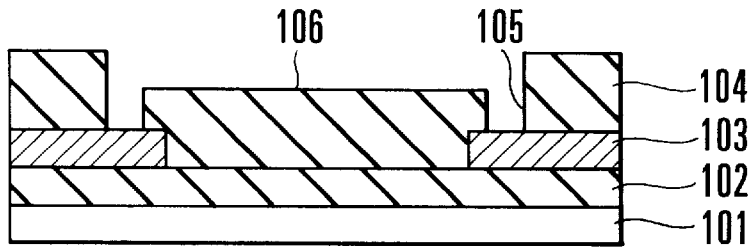

As shown in FIG. 1B, a contact hole 105 for electrically connecting the lower wiring layer 103 is formed at a predetermined position in the interlevel insulating film 104. A wiring groove 106 passing the contact hole 105 is formed in the interlevel insulating film 104. Although the wiring groove 106 is formed after the contact hole 105 is formed, the present invention is not limited to this. For example, the contact hole 105 may be formed after the wiring groove 106 is formed.

A native oxide film formed on the surface of the lower wiring layer 103 exposed at the bottom of the contact hole 105 is removed. In this removal, the bottom of the contact hole 105 is exposed to a chlorine-based gas plasma. The plasma is generated by supplying $Cl_2$ gas at a flow rate of 10 sccm and Ar gas at a flow rate of 50 sccm to a chamber evacuated to a pressure of about 3 mTorr, and applying the 13.56-MHz RF to the chamber at an output of 20 W.

Figure 1C:
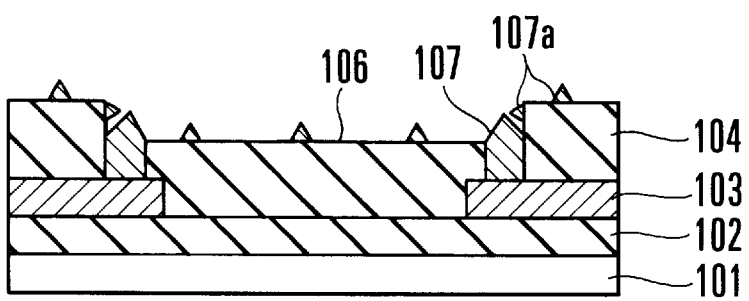

As shown in FIG. 1C, aluminum (first conductive material) is selectively deposited on the lower wiring layer 103 exposed at the bottom of the contact hole 105 to form an aluminum layer (contact) 107. The aluminum layer 107 is formed by CVD using dimethylaluminum hydride (($CH_3$)$_2$AlH) as a precursor.

In this case, a substrate temperature H is set to 200° C., and the flow rate of the source gas is set to 100 sccm for dimethylaluminum hydride and 300 sccm for hydrogen carriers. The 0.5-μm deep contact hole 105 is filled within about 2 min. At this time, aluminum islands 107a with a height of about 0.3 μm are formed on the interlevel insulating film 104.

Figure 1D:
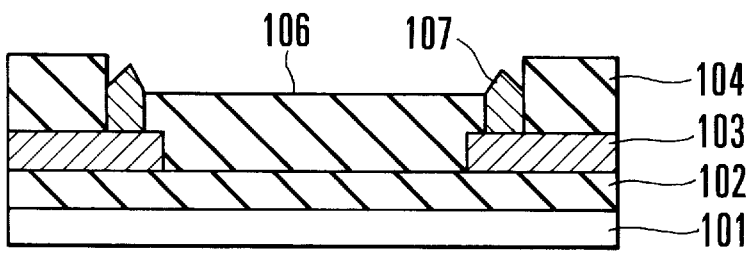

While $BCl_3$ gas and Ar gas are supplied at a flow rate of 50 sccm, the 13.56-MHz RF is applied to generate an RF plasma (atmosphere in which the first conductive material is etched). The semiconductor substrate 101 is exposed to this RF plasma to remove the islands 107a formed on the insulating film 104, as shown in FIG. 1D. At this time, the aluminum layer 107 is also etched by about 0.1 μm.

Figure 1E:
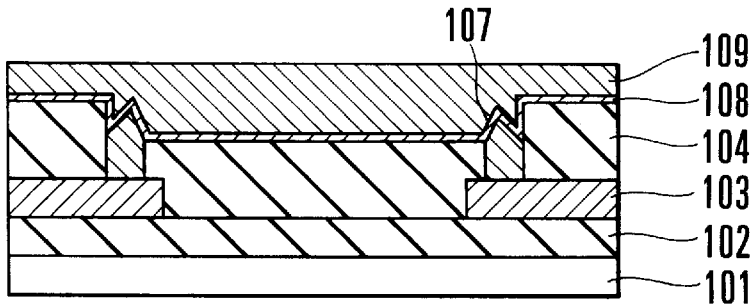

As shown in FIG. 1E, a titanium nitride film 108 is formed thin on the insulating film 104 and the aluminum layer 107 by CVD. In this CVD, tetrakisdimethylaminotitanium is used as a source gas. The titanium nitride film 108 is continuously formed in contact with the surfaces of the insulating film 104 and the aluminum layer 107 without being broken and forming any gap at the boundary of the insulating film 104 and the aluminum layer 107.

An aluminum film 109 (second conductive material) is formed to a film thickness of 2 μm by CVD. In this CVD, dimethylaluminum hydride is used as a source gas.

Figure 1F:
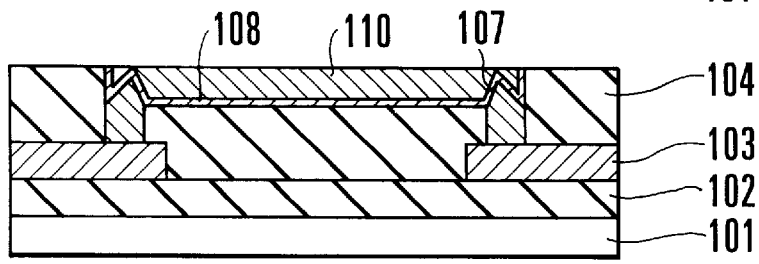

As shown in FIG. 1F, the aluminum film 109 and he titanium nitride film 108 are removed by chemical-mechanical polishing (CMP) so as to expose the surface of the interlevel insulating film 104, thereby forming a flat upper wiring layer (second wiring layer) 110. In this CMP, e.g., $Al_2O_3$ or $SiO_2$ is used as a slurry, and a cleaning agent of 3 to 11 pH is used.

According to the first embodiment, since no gap is formed at the boundary of the interlevel insulating film 104 and the upper wiring layer 110, the cross-sectional wiring area does not partially decrease in the upper wiring layer 110. The reliability of the semiconductor device can be improved without causing any electromigration.

Second Embodiment

FIGS. 2A to 2F show a method of manufacturing a semiconductor device according to the second embodiment of the present invention, and particularly show the process of forming a wiring layer.

In the steps in FIGS. 2A to 2D, a lower wiring layer 203, a wiring groove 206, and an aluminum layer 207 are formed on a semiconductor substrate 201. Reference numeral 202 denotes an insulating film; 204, an interlevel insulating film; 205, a contact hole; and 207a, an island. The steps in FIGS. 2A to 2D are the same as those in FIGS. 1A to 1D, and a description thereof will be omitted.

Figure 2A:
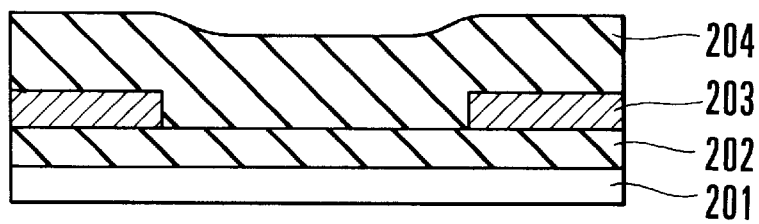
FIGS. 2A to 2F are cross-sectional views, respectively, showing a method of manufacturing a semiconductor device according to the second embodiment of the present invention.
Figure 2B:
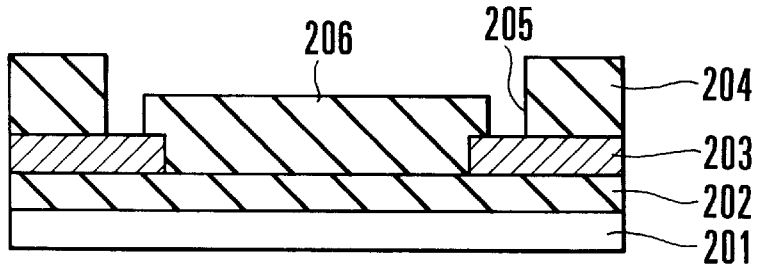
Figure 2C:
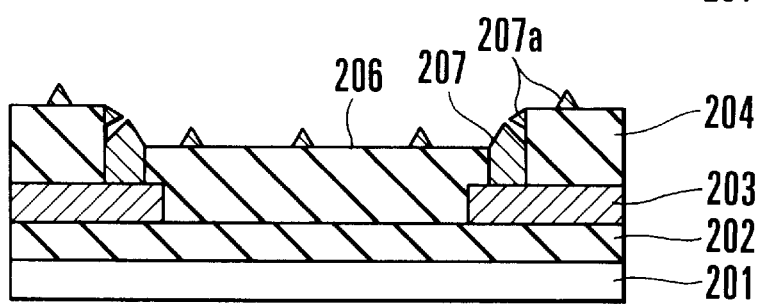
Figure 2D:
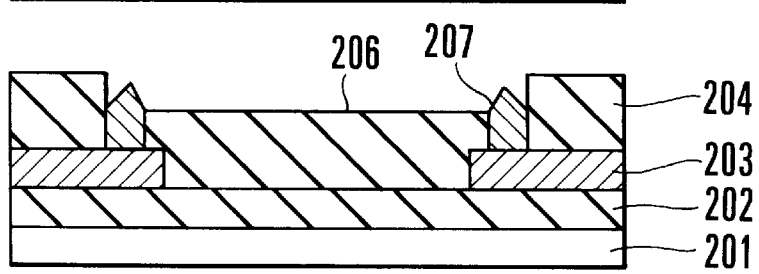
Figure 2E:
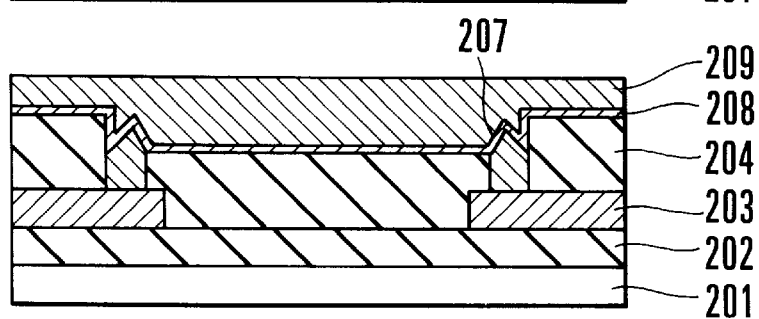

A titanium film 208 is deposited to about 30 nm on the interlevel insulating film 204 and the aluminum layer 207 by collimated sputtering. AlCu is deposited on the titanium film 208 in vacuum, and then the obtained structure is heated to 450° C. for 10 min (reflow sputtering). As a result, an AlCu film 209 is formed on the titanium film 208 to completely fill the contact hole 205 and the wiring groove 206, as shown in FIG. 2E.

In the above-described reflow sputtering, an Al alloy is sputtered to form a film, and the obtained structure is heated in vacuum to flow the Al film and alloy atoms to recesses of the underlayer and fill the recesses. By this method, recesses with an aspect ratio of 2 and a depth of about 0.1 μm can be filled with the Al alloy.

The method of filling recesses includes high-temperature sputtering. According to this method, an AlCu alloy is sputtered while a film-formed substrate is heated to 450° C.

Figure 2F:
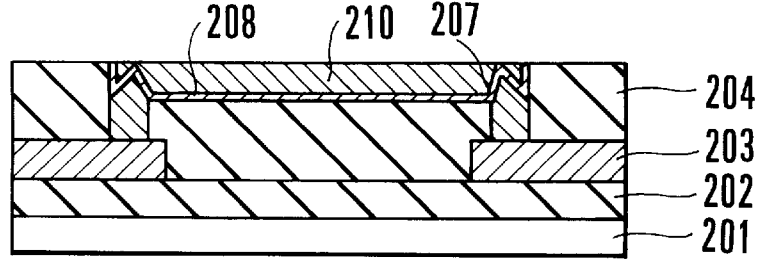
Figure 3A:
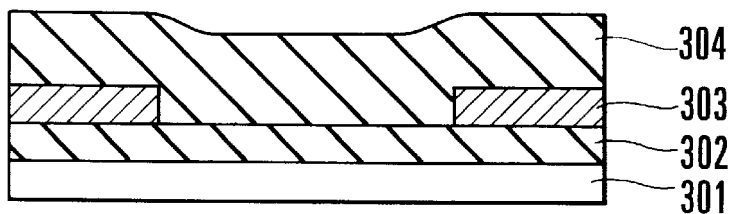
FIGS. 3A to 3F are cross-sectional views, respectively, showing a method of manufacturing a conventional semiconductor device.
Figure 3B:
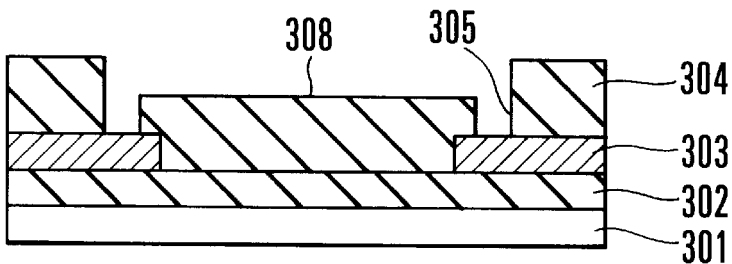
Figure 3C:
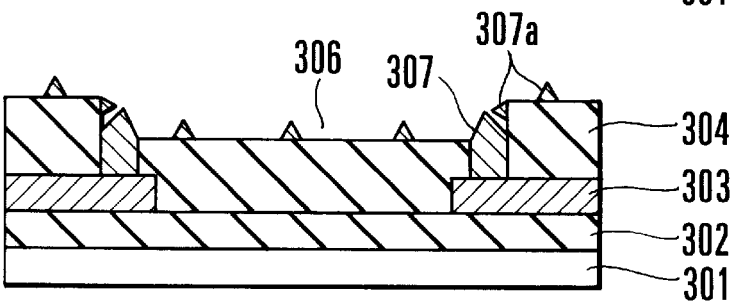
Figure 3D:
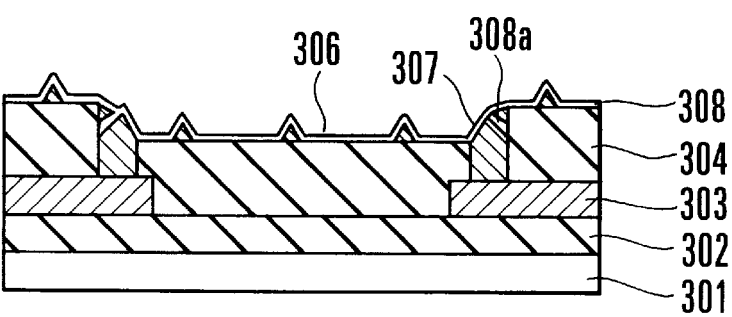
Figure 3E:
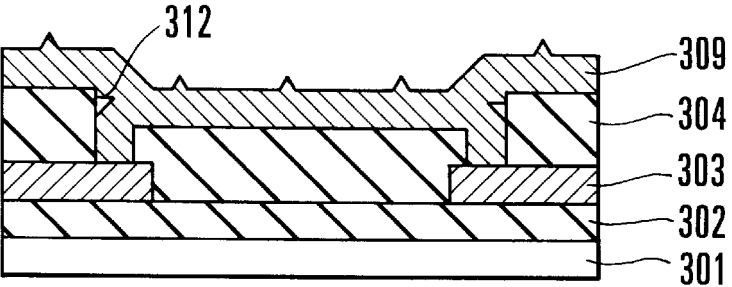
Figure 3F:
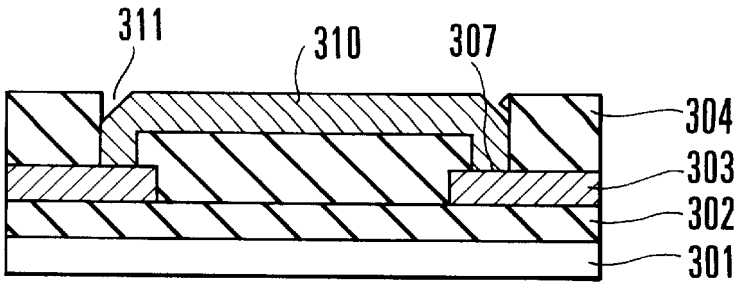

As shown in FIG. 2F, the AlCu film 209 and the titanium film 208 are removed by CMP from the interlevel insulating film 204 to form a flat upper wiring layer 210. In this CMP, $Al_2O_3$ or $SiO_2$ is used as a slurry, and these slurries have a hydrogen ion exponent of 3 to 11 pH.

According to the second embodiment, similar to the first embodiment, since the cross-sectional wiring area does not partially decrease in the upper wiring layer 210, the reliability of the semiconductor device can be improved without causing any electromigration.

In the second embodiment, since an AlCu alloy is used for the interconnect, the electromigration resistance can be enhanced. The contact reliability in the contact hole 205 is also improved because Cu diffuses from the AlCu film 209 to the aluminum layer 207 formed in the contact hole 205.

Each embodiment has exemplified the case wherein the interconnect is made of aluminum or an aluminum alloy, but the present invention is not limited to this. The interconnect may be made of gold or copper using a β-diketone metal complex.

For example, a gold thin film can be formed by CVD using gold acetylacetonate at a substrate temperature of 300° C., a carrier Ar flow rate of 100 sccm, and a total pressure of 1 Torr. In this case, CVD conditions can be arbitrarily selected as far as the gold thin film can be deposited.

A copper interconnect can be formed by CVD using copper acetylacetonate, copper dipivaloylmethane, or copper heptafluorobutanoylpivaloylmethane. A copper thin film can be formed using such a precursor at a substrate temperature of 300 to 500° C., a carrier Ar flow rate of 100 sccm, and a total pressure of 1 Torr. The conditions can be arbitrarily selected so long as the copper thin film can be deposited. The copper thin film and the copper interconnect may be formed using a hexafluoroacetylacetonato copper vinyltrimethylsilane (copper compound).

Although aluminum or an aluminum alloy is formed on the entire substrate surface by sputtering in the respective embodiments, the present invention is not limited to this. The metal film can be formed on the entire substrate surface using CVD. For example, an aluminum thin film can be formed on the entire substrate surface by CVD using triisobutylaluminum as a precursor at a substrate temperature of 350° C. and a total pressure of 3 Torr.

The aluminum film is deposited by CVD using dimethylaluminum hydride or triisobutylaluminum, but the present invention is not limited to this. The precursor for forming the aluminum film by CVD includes an aluminum hydride amine adduct such as trimethylaminealane or a mixture of a plurality of organic aluminums.

As has been described above, according to the present invention, after a conductive layer is formed, the resultant structure is exposed to an atmosphere in which the first conductive material is etched, thereby etching islands made of the first conductive material present on the surface of an interlevel insulating film. No unwanted projection therefore exists on the underlayer in burying the second conductive material in a groove. No gap is formed between the interlevel insulating film and the buried second conductive material. As a result, a flat wiring layer can be formed in a multilevel interconnect without degrading the reliability of a semiconductor device.

What is claimed is:

1. A method of manufacturing a semiconductor device, comprising the steps of:

forming a first wiring layer on a semiconductor substrate;

forming an interlevel insulating film on said semiconductor substrate to cover said first wiring layer;

forming a wiring groove in said interlevel insulating film to pass a contact hole formed in said interlevel insulating film to a depth so as to expose said first wiring layer, said contact hole when viewed from a side view has a right side and a left side, said interlevel insulating film is at a different height on the left side as compared to the right side of the contact hole;

forming a contact in the contact hole by depositing a first conductive material on said first wiring layer exposed at a bottom of the contact hole;

etching and removing an island made of the first conductive material and formed on a surface of said interlevel insulating film upon forming the contact; and forming a second wiring layer in contact with the contact by burying a second conductive material in the wiring groove.

2. A method according to claim 1, wherein the step of forming the wiring groove comprises the steps of:

forming the contact hole in said interlevel insulating film to a depth so as to expose a surface of said first wiring layer; and forming the wiring groove passing the contact hole in said interlevel insulating film.

3. A method according to claim 1, wherein the step of forming the wiring groove comprises the steps of:

forming the wiring groove partially overlapping said first wiring layer in said interlevel insulating film; and forming the contact hole to a depth so as to expose a surface of said first wiring layer in said interlevel insulating film at a position where the wiring groove overlaps said first wiring layer.

4. A method according to claim 1, wherein the step of removing said island comprises the step of exposing the surface of said interlevel insulating film including a surface of the contact to a halogen-containing gas plasma.

5. A method according to claim 4, wherein the step of forming the contact comprises the step of forming the contact by chemical vapor deposition using one of $(CH_3)_2AlH$, $(I\text{-butyl})_3Al$, and $N(CH_3)_2(C_2H_5)AlH_3$, and the step of removing said island comprises the step of exposing the surface of said interlevel insulating film including the surface of the contact to a plasma using at least one material selected from the group consisting of $BCl_3$, $CCl_4$, $Cl_2$, $PCl_3$, $PCl_5$, and $HCl$.

6. A method according to claim 1, wherein the step of forming said second wiring layer comprises the steps of:

depositing the second conductive material on said interlevel insulating film including the wiring groove; and forming said second wiring layer made of the second conductive material in the wiring groove by removing the second conductive material until the surface of said interlevel insulating film is exposed except for the wiring groove.

7. A method according to claim 6, wherein the step of depositing the second conductive material comprises the steps of:

forming a thin titanium nitride film by CVD on said interlevel insulating film including the wiring groove; and forming an aluminum film by CVD on said titanium nitride film.

8. A method according to claim 6, wherein the step of depositing the second conductive material comprises the steps of:

forming a thin titanium nitride film by collimated sputtering on said interlevel insulating film including the wiring groove; and depositing an AlCu film on said titanium nitride film by reflow sputtering, and heating said AlCu film in vacuum.

9. A method according to claim 6, wherein the step of removing the second conductive material comprises the step of polishing the second conductive material by chemical-mechanical polishing.

* * * * *